US012749643B2

(12) United States Patent
Igari et al.

(10) Patent No.: US 12,749,643 B2
(45) Date of Patent: Sep. 29, 2026

(54) CHARGED PARTICLE GUN AND CHARGED PARTICLE BEAM APPARATUS

(71) Applicant: Hitachi High-Tech Corporation, Tokyo (JP)

(72) Inventors: Tomoya Igari, Tokyo (JP); Masahiro Fukuta, Tokyo (JP); Takashi Doi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 333 days.

(21) Appl. No.: 18/391,808

(22) Filed: Dec. 21, 2023

(65) Prior Publication Data

US 2024/0212966 A1 Jun. 27, 2024

(30) Foreign Application Priority Data

Dec. 22, 2022 (JP) ................................ 2022-205756

(51) Int. Cl.

*H01J 37/07* (2006.01)
*H01J 37/073* (2006.01)
*H01J 37/28* (2006.01)

(52) U.S. Cl.

CPC ............ *H01J 37/073* (2013.01); *H01J 37/28* (2013.01); *H01J 2237/06316* (2013.01); *H01J 2237/06375* (2013.01); *H01J 2237/2817* (2013.01)

(58) Field of Classification Search

CPC ..................... H01J 37/073; H01J 37/28; H01J 2237/06316; H01J 2237/06375; H01J 2237/2817

See application file for complete search history.

(56) References Cited

U.S. PATENT DOCUMENTS

2012/0217391 A1 8/2012 Shichi et al.
2015/0187533 A1* 7/2015 Dinu-Gurtler ........ H01J 37/075 313/308

(Continued)

FOREIGN PATENT DOCUMENTS

JP 6-124878 A 5/1994
JP 2014-107143 A 6/2014

(Continued)

OTHER PUBLICATIONS

Korean-language Office Action issued in Korean Application No. 10-2023-0188108 dated Mar. 28, 2025 (7 pages).

(Continued)

*Primary Examiner* — Nicole M Ippolito
(74) *Attorney, Agent, or Firm* — Crowell & Moring LLP

(57) ABSTRACT

Provided are a charged particle gun and a charged particle beam apparatus that can reduce instability in the amount of emitted charged particles and deviation in the charged particle trajectory when the amount of charged particle beams is increased. A charged particle gun includes a charged particle source that generates a charged particle, an electrode portion that includes an extraction electrode for extracting a charged particle beam from the charged particle source, a voltage introduction unit that introduces voltage to the electrode portion, and a temperature adjustment unit that adjusts a temperature of the electrode portion. The temperature adjustment unit is configured to adjust the temperature of the electrode portion based on a change in a state of the electrode portion.

10 Claims, 15 Drawing Sheets

(56) References Cited

U.S. PATENT DOCUMENTS

| | | | |
|---|---|---|---|
| 2020/0090897 | A1 | 3/2020 | Kasuya et al. |
| 2022/0230835 | A1 | 7/2022 | Kaneda |

FOREIGN PATENT DOCUMENTS

| | | | |
|---|---|---|---|
| KR | 10-2021-0151969 | A | 12/2021 |
| TW | 201532096 | A | 8/2015 |
| TW | 201705179 | A | 2/2017 |

OTHER PUBLICATIONS

Chinese-language Office Action issued in Taiwanese Application No. 112149978 dated Sep. 11, 2024 (8 pages).

* cited by examiner

[FIG. 1]
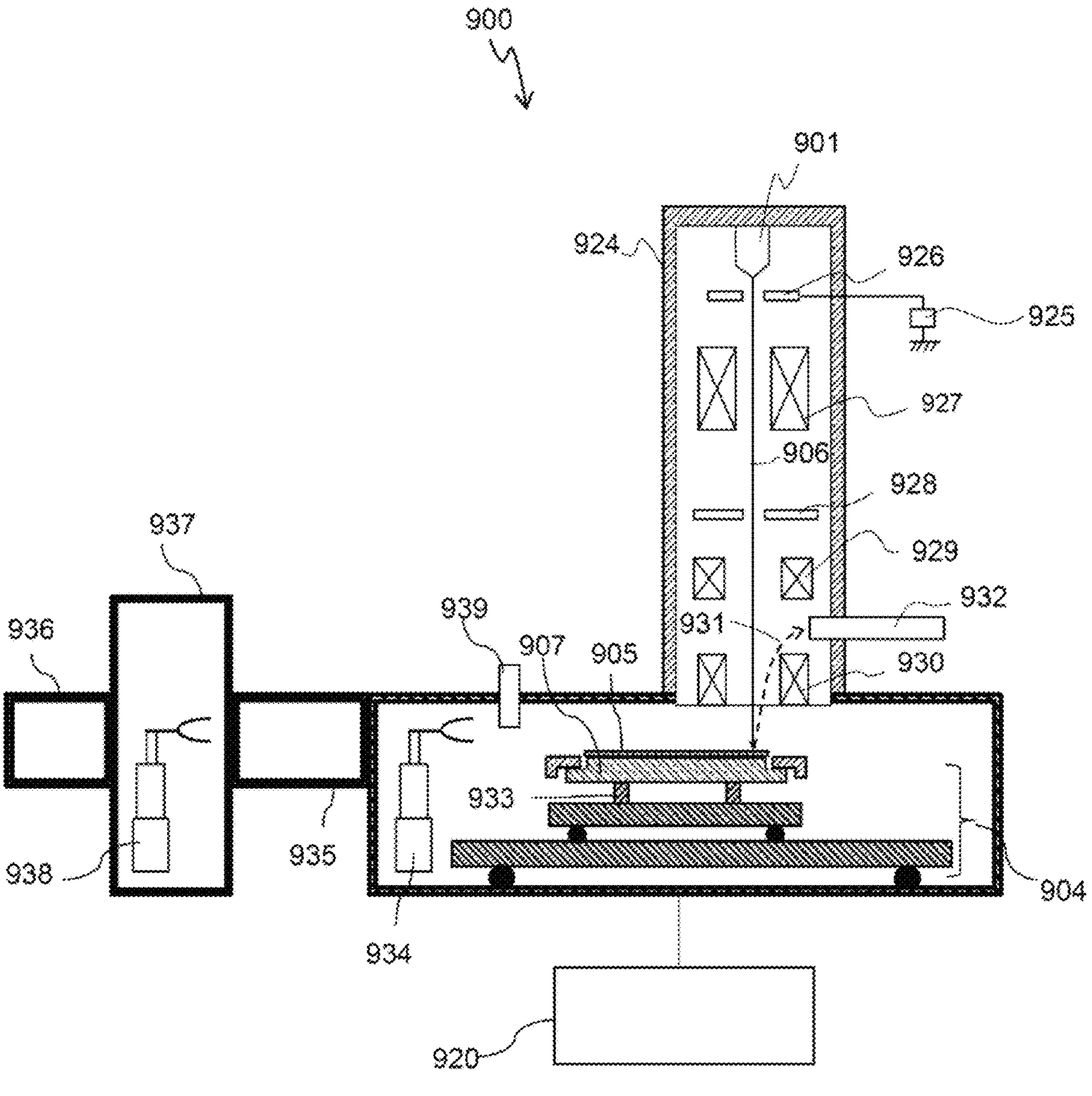

[FIG. 2]
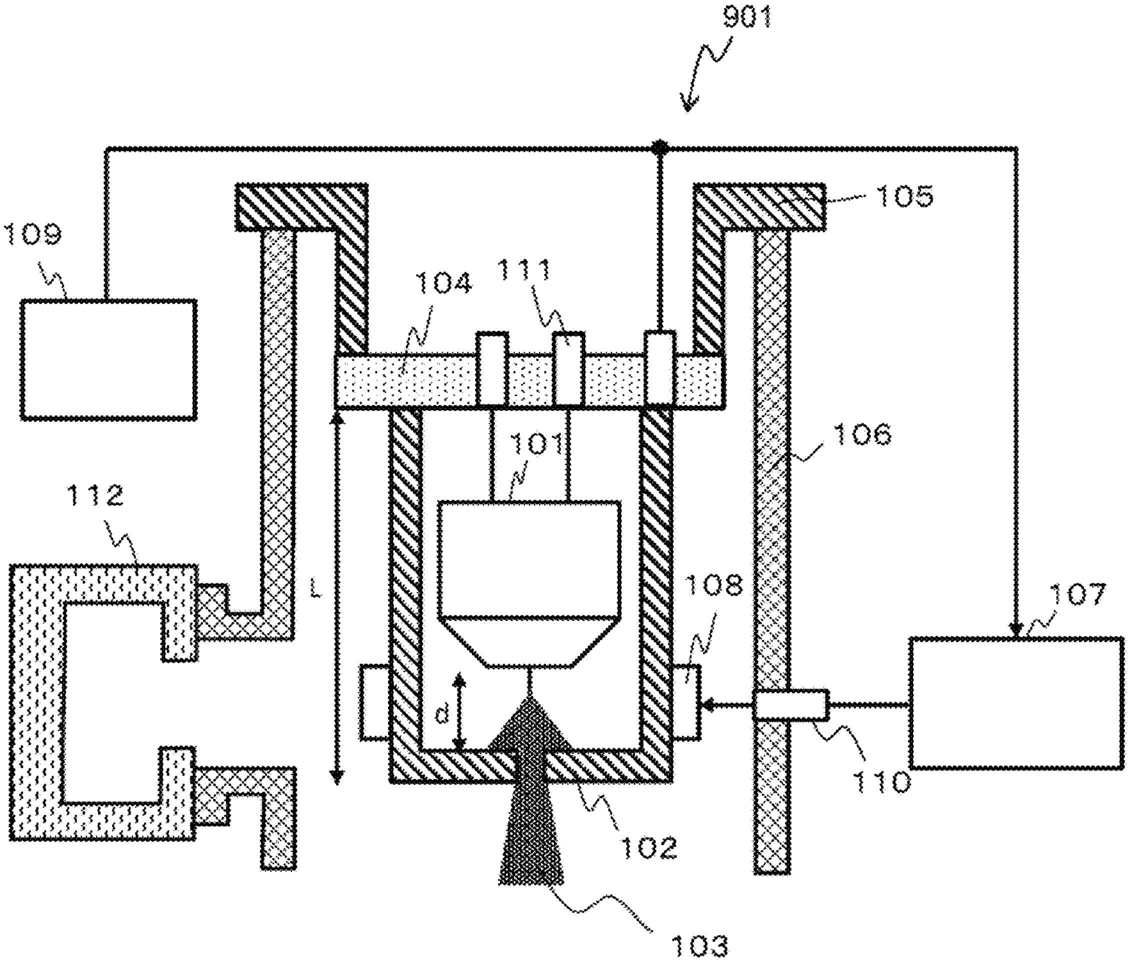

[FIG. 3]
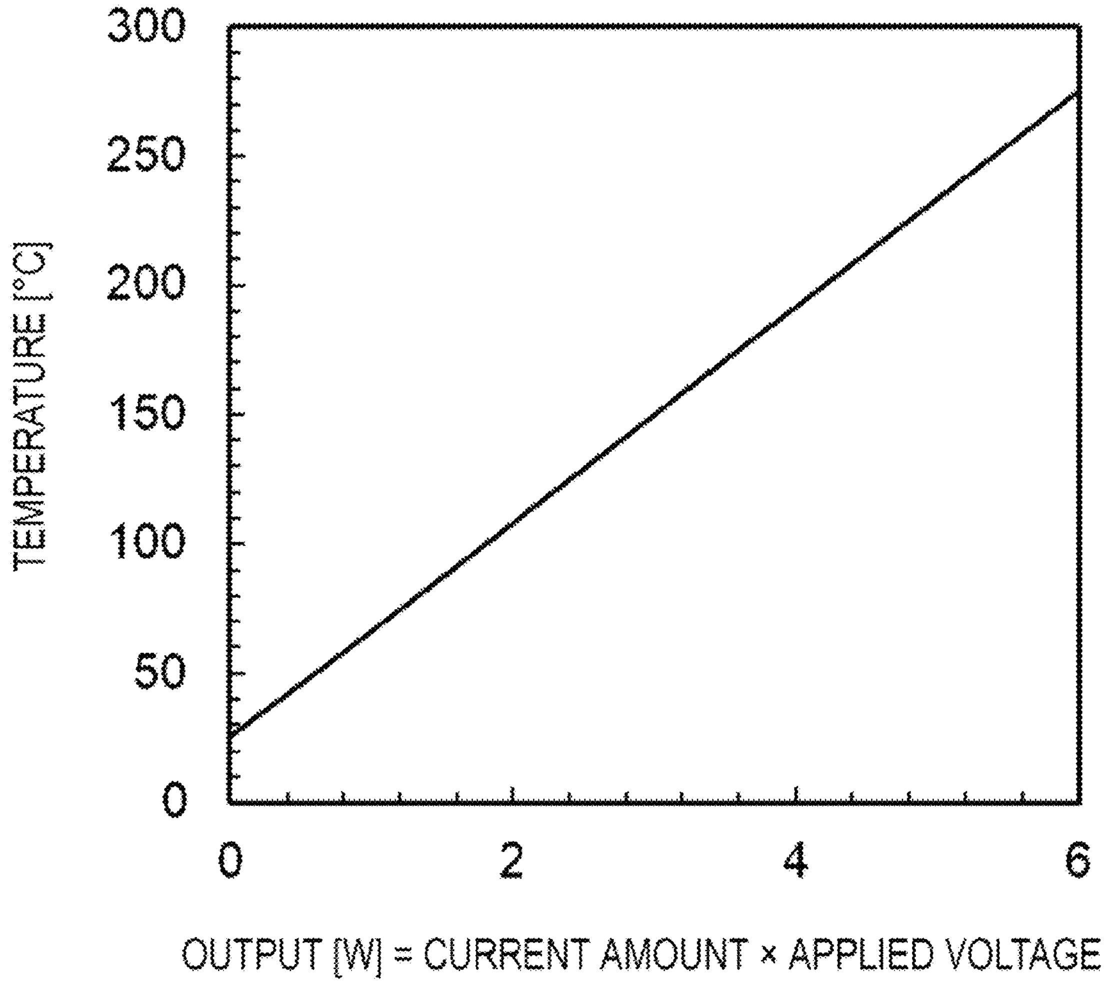

[FIG. 4]
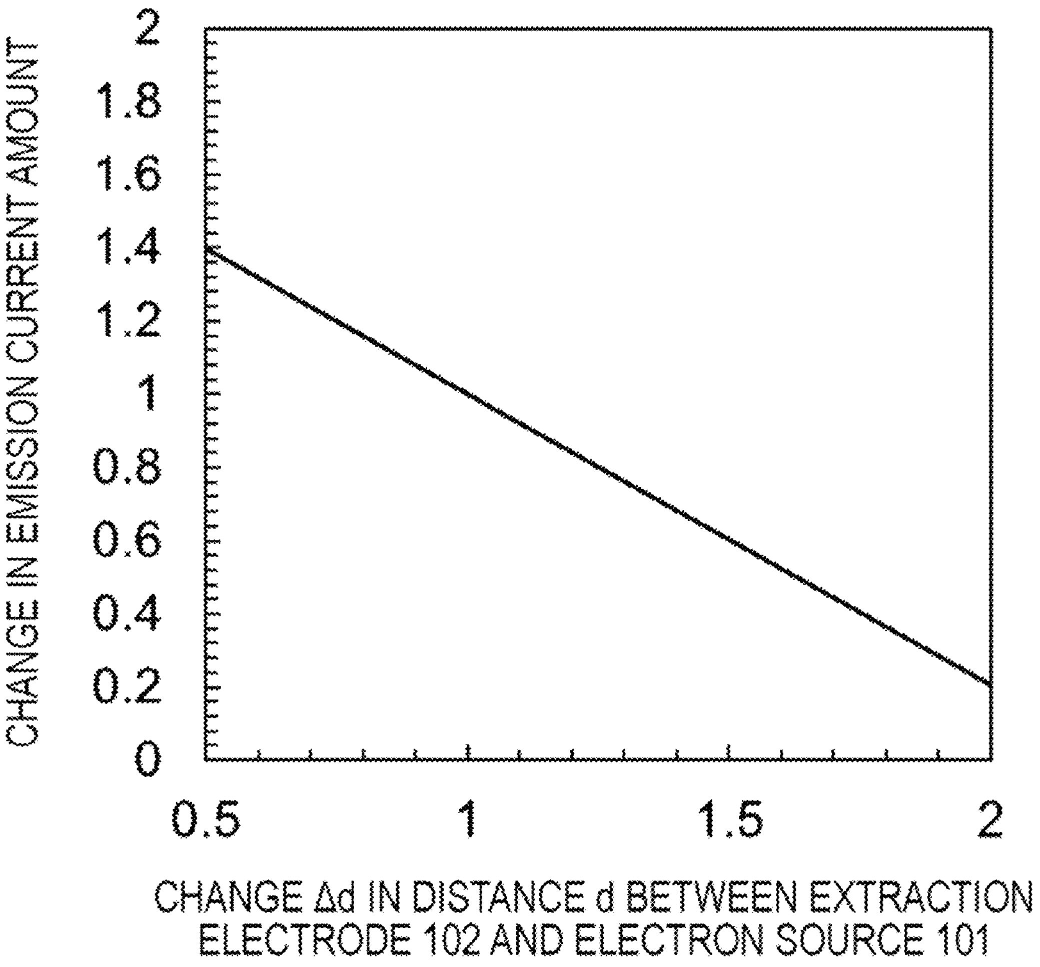

[FIG. 5A]
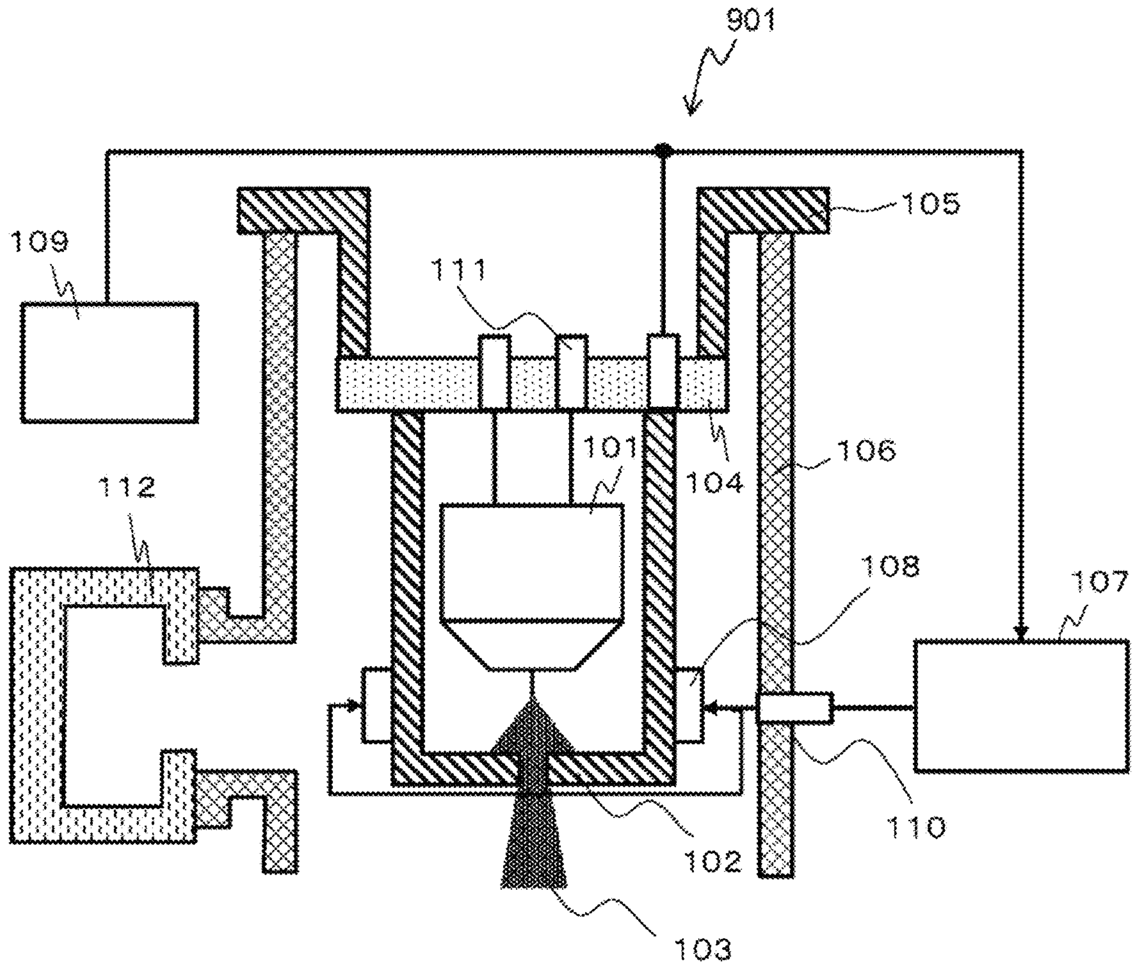
[FIG. 5B]
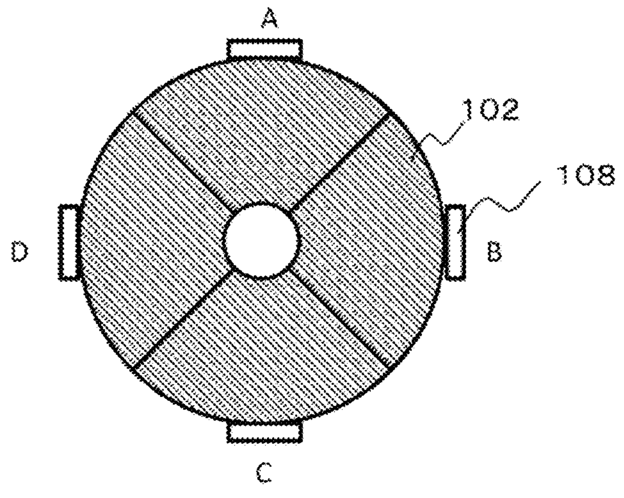

[FIG. 5C]
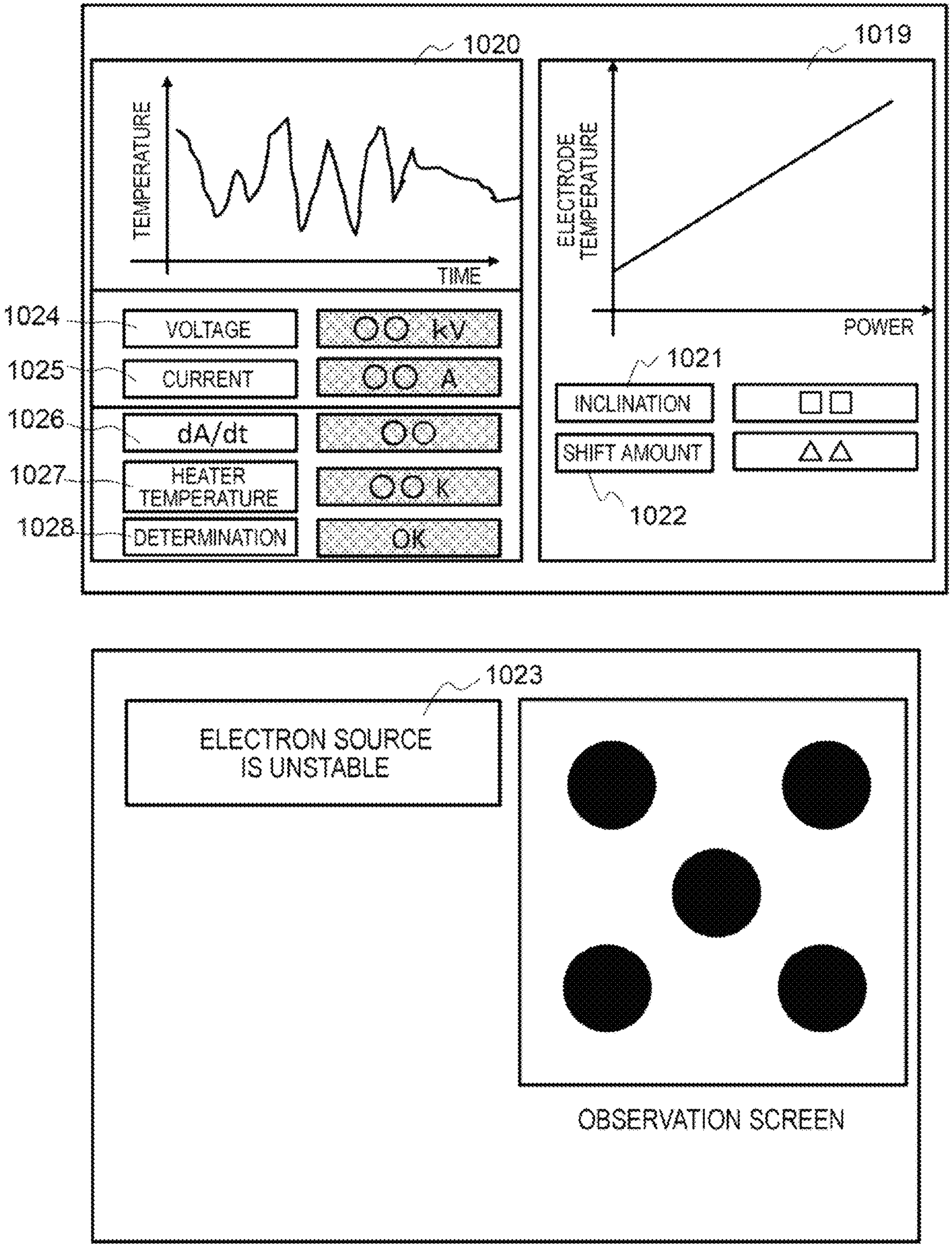

[FIG. 6]
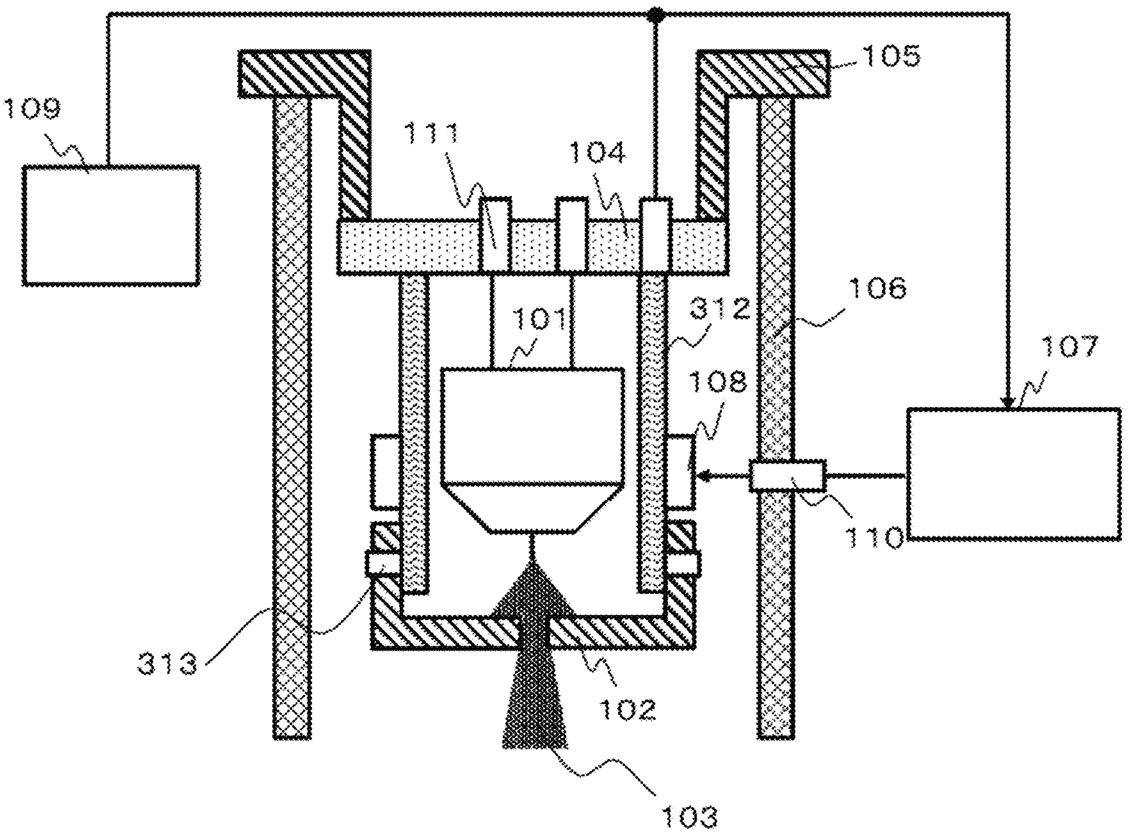

[FIG. 7A]
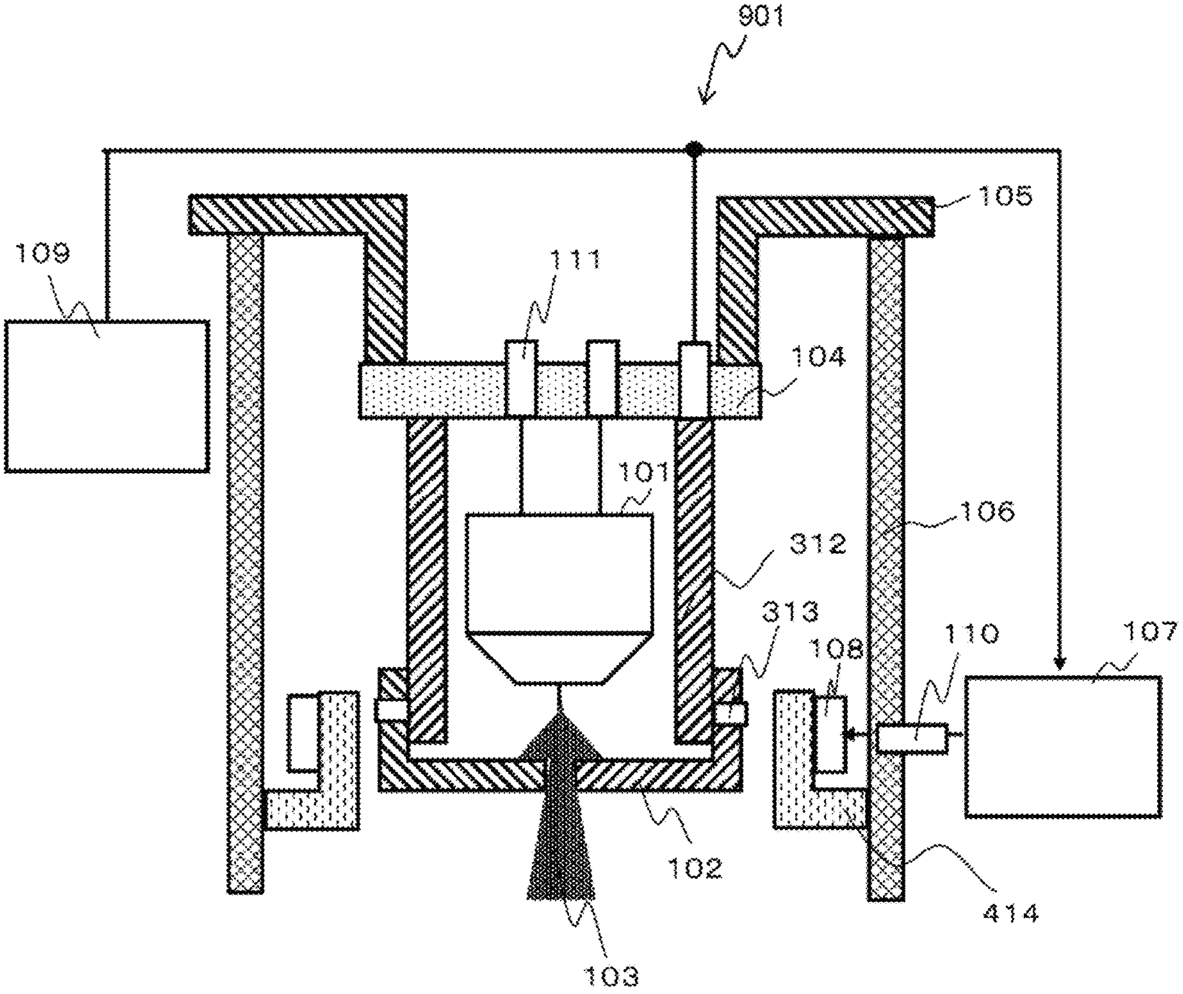

[FIG. 7B]
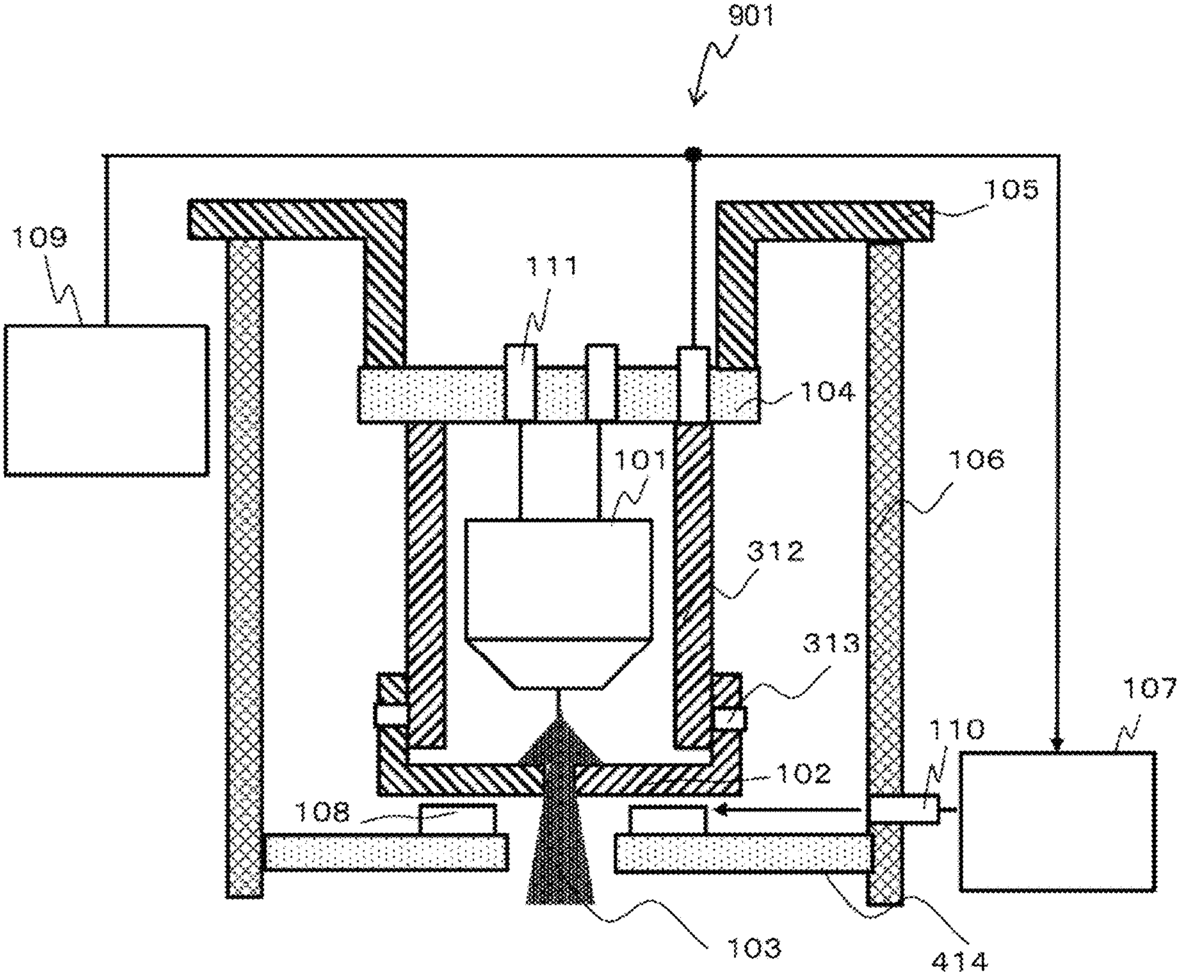

[FIG. 8]
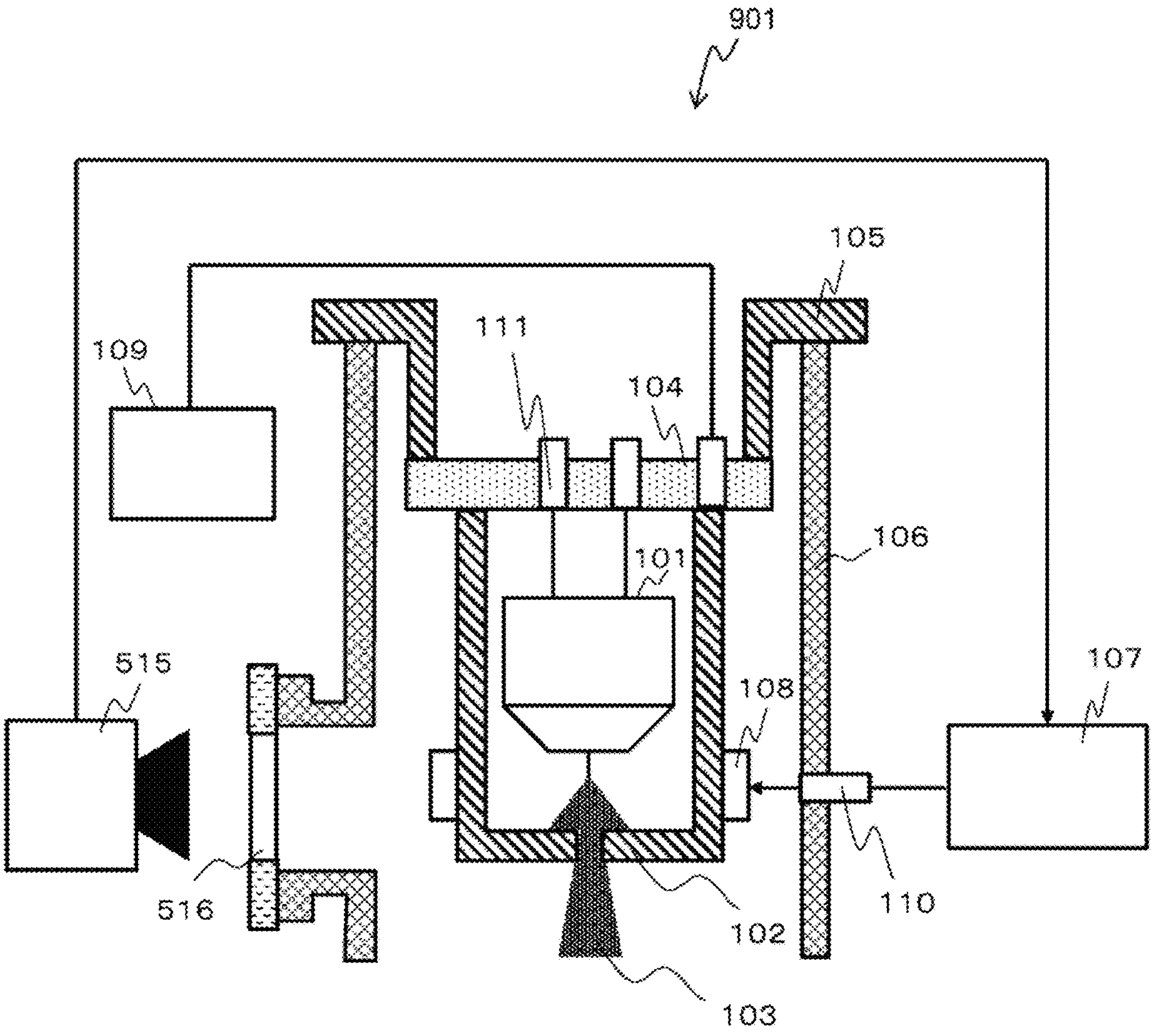

[FIG. 9]
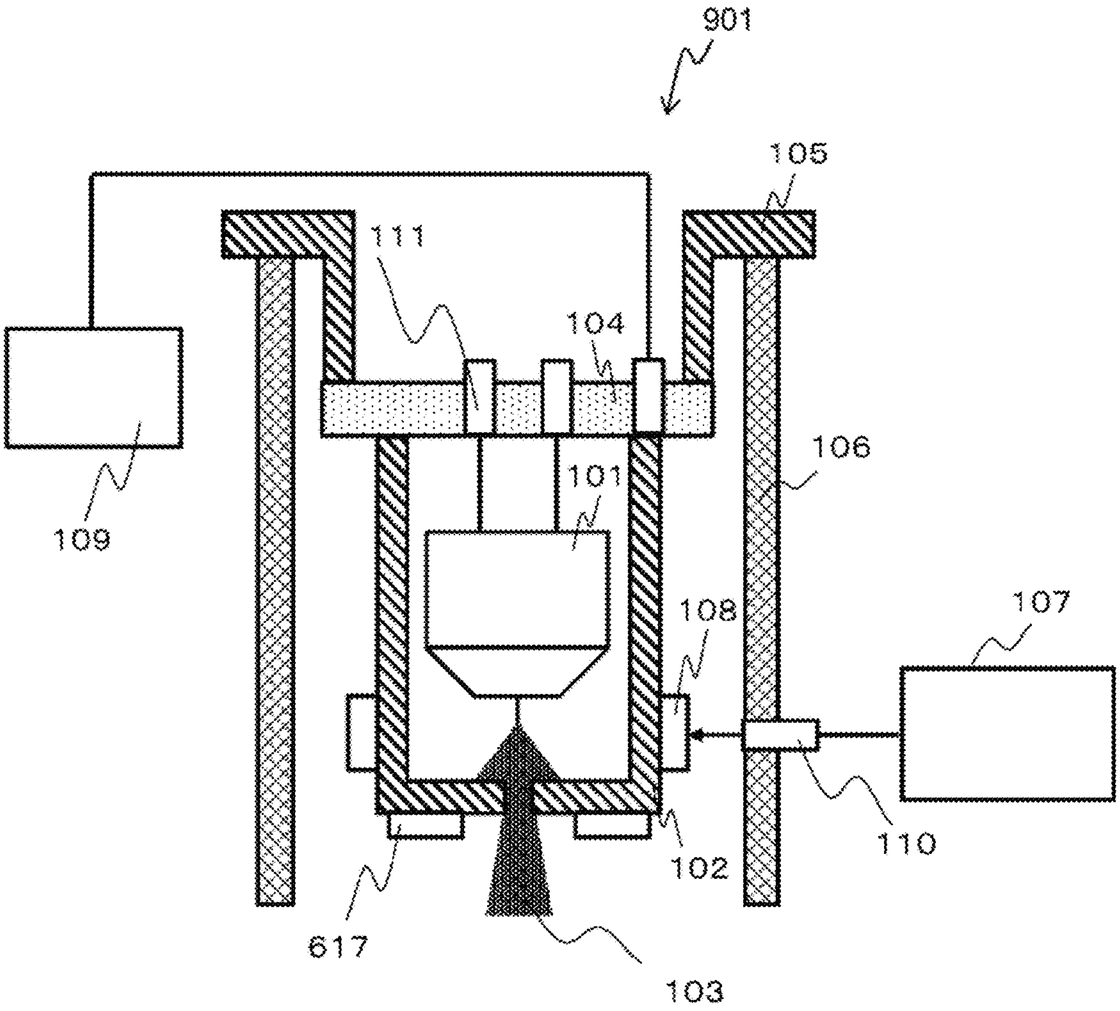

BOTTOM VIEW A

ENLARGED VIEW B

[FIG. 11]
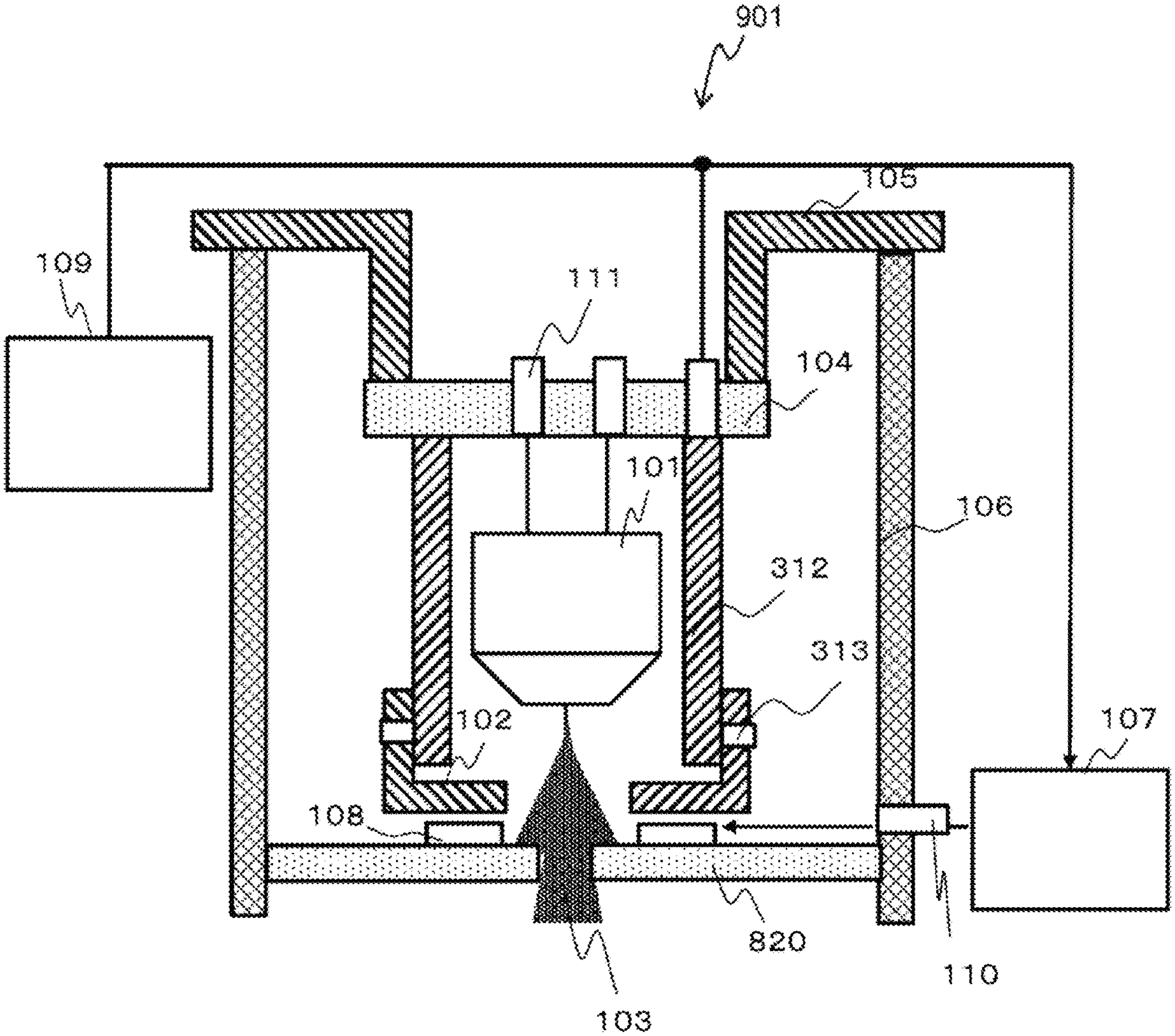

[FIG. 12]
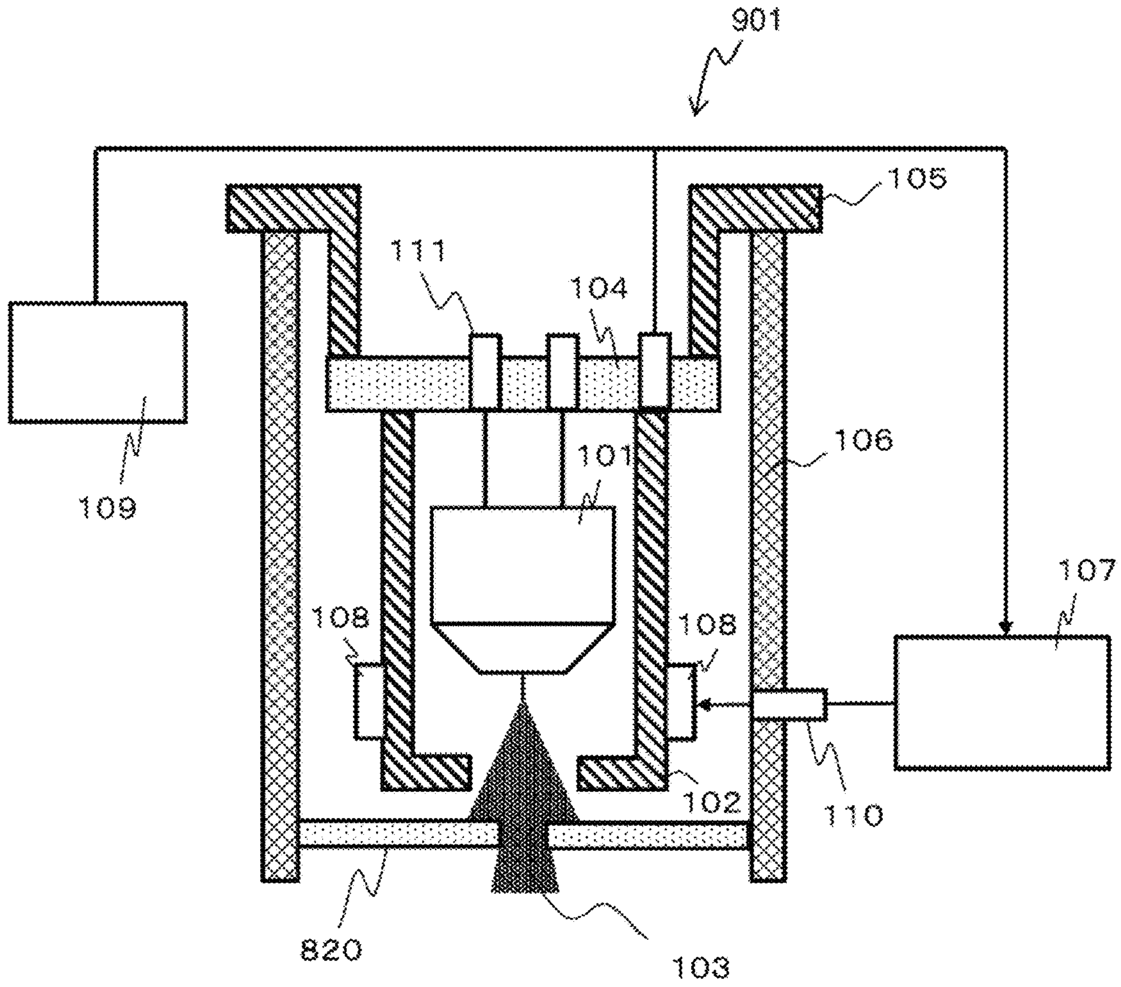

[FIG. 13]
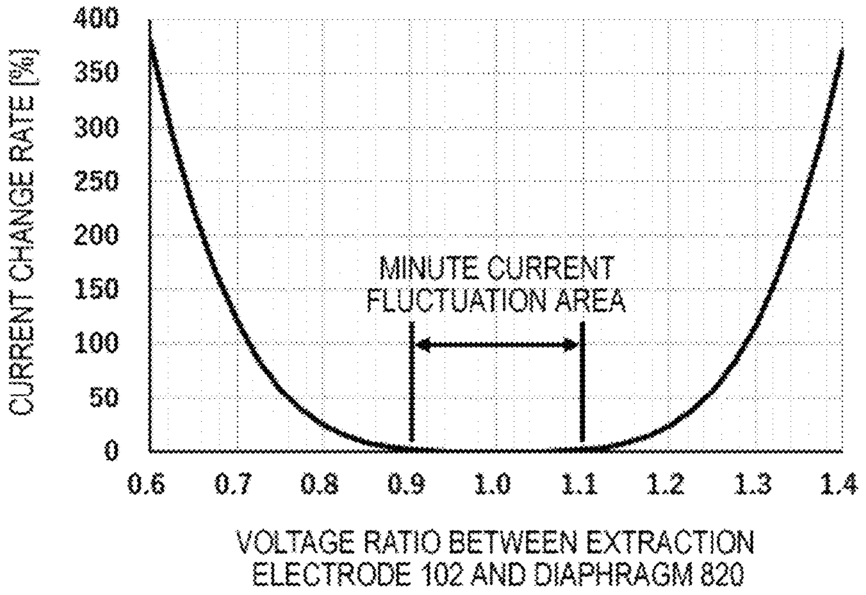

CHARGED PARTICLE GUN AND CHARGED PARTICLE BEAM APPARATUS

TECHNICAL FIELD

The present invention relates to a charged particle gun and a charged particle beam apparatus.

BACKGROUND ART

In a semiconductor measurement/inspection apparatus market, there is a growing demand to increase the number of measurement points and observation area of a wafer. In particular, in EUV lithography using extreme ultraviolet light, observation of an entire surface of the wafer is essential, and in an inspection and measurement apparatus using a charged particle beam apparatus, it generally takes several days to several tens of days to inspect defects and dimensions. Therefore, in the semiconductor measurement/inspection apparatus, it is required to improve throughput of the apparatus and to operate stably over a long period of time (current fluctuation of 1% or less).

To improve the throughput of the inspection and measurement apparatus and ensure stable operation over a long period of time, the charged particle beam apparatus that can stably emit a charged particle beam at large current is required. Therefore, in the charged particle beam apparatus, a charged particle gun (current fluctuation of 1% or less) that can stably emit a charged particle beam of large current over a long period of time is required. From such point of view, PTL 1 discloses a technology in which a periphery of an extraction electrode is preheated to stably emit a charged particle beam of large current, thereby preventing electron stimulated desorption (ESD) gas.

However, when an amount of charged particle beams emitted from a charged particle source is increased, since an extraction electrode of high voltage or an electrode that adjusts a current amount are irradiated with electrons, there is a problem in that heat is generated in the electrodes and the amount of charged particle beams emitted becomes unstable. As the amount of charged particle beams emitted from the charged particle source toward the electrode changes, an amount of generated heat changes from moment to moment, and thermal expansion of the electrode also changes from moment to moment. Therefore, a trajectory of the emitted charged particles may be deviated. As such, when the amount of charged particle beams is increased, it has not been easy with related-art technology to stabilize the amount of charged particles emitted and reduce the trajectory deviation.

CITATION LIST

Patent Literature

PTL 1: JP2014-107143A

SUMMARY OF INVENTION

Technical Problem

The present disclosure provides a charged particle gun and a charged particle beam apparatus can reduce instability in the amount of emitted charged particles and deviation in the charged particle trajectory when the amount of charged particle beams is increased.

Solution to Problem

A charged particle gun according to the present disclosure includes a charged particle source that generates a charged particle, an electrode portion that includes an extraction electrode for extracting a charged particle beam from the charged particle source, a voltage introduction unit that introduces voltage to the electrode portion, and a temperature adjustment unit that adjusts a temperature of the electrode portion. The temperature adjustment unit is configured to adjust the temperature of the electrode portion based on a change in a state of the electrode portion.

Advantageous Effects of Invention

According to the present disclosure, it is possible to provide the charged particle gun and the charged particle beam apparatus that can reduce instability in the amount of emitted charged particles and deviation in the charged particle trajectory when the amount of charged particle beams is increased.

BRIEF DESCRIPTION OF DRAWINGS

FIG. 1 is a schematic diagram showing a configuration example of a charged particle beam system according to a first embodiment.

FIG. 2 is a cross-sectional view showing a configuration example of an electron gun 901 according to the first embodiment.

FIG. 3 shows an example of a table showing a relationship between an output [W], which is a product of a current amount and an applied voltage of an extraction electrode 102, and a temperature of a heater 108.

FIG. 4 is a graph showing results of an electric field analysis when a distance d between the extraction electrode 102 and an electron source 101 is varied.

FIG. 5A shows a modification of the first embodiment.

FIG. 5B shows a modification of the first embodiment.

FIG. 5C shows a modification of the first embodiment.

FIG. 6 is a cross-sectional view showing a configuration example of an electron gun 901 according to a second embodiment.

FIG. 7A is a cross-sectional view showing a configuration example of an electron gun 901 according to a third embodiment.

FIG. 7B is a cross-sectional view showing a configuration example of an electron gun 901 according to a modification of the third embodiment.

FIG. 8 is a cross-sectional view showing a configuration example of an electron gun 901 according to a fourth embodiment.

FIG. 9 is a cross-sectional view showing a configuration example of an electron gun 901 according to a fifth embodiment.

FIG. 11 is a cross-sectional view showing a configuration example of an electron gun 901 according to a seventh embodiment.

FIG. 12 is a cross-sectional view showing a configuration example of the electron gun 901 according to the seventh embodiment.

FIG. 13 is a graph showing a relationship between a voltage ratio of the extraction electrode 102 and a diaphragm 820 and a current change rate in the electron gun of the seventh embodiment.

DESCRIPTION OF EMBODIMENTS

Figure 10A:
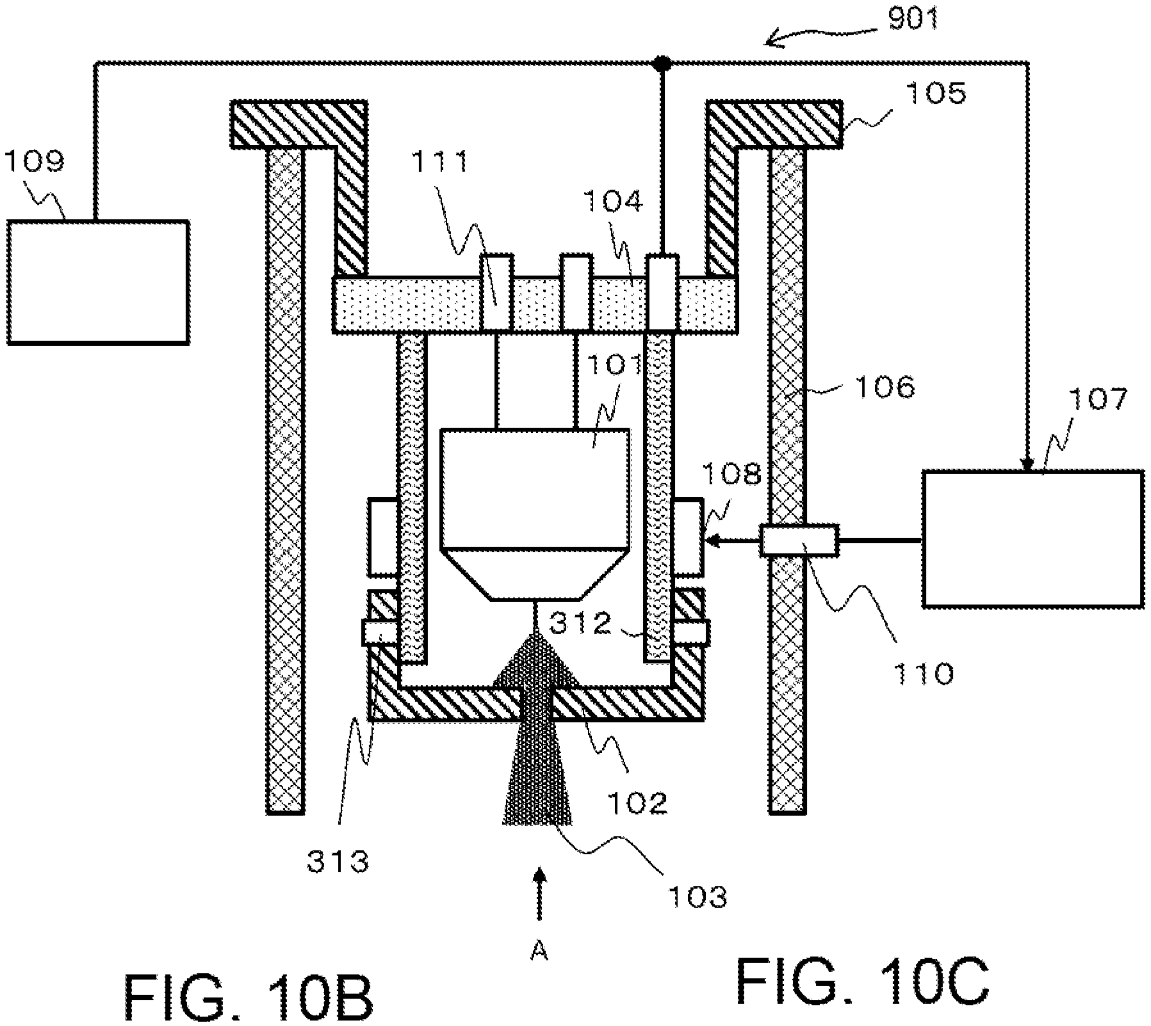
FIGS. 10A to 10C are cross-sectional views showing a configuration example of an electron gun 901 according to a sixth embodiment.

Embodiments will be described below with reference to the accompanying drawings. In the accompanying drawings, elements that are functionally the same may be denoted by the same number. Although the accompanying drawings illustrate embodiments and implementation examples according to the principle of the present disclosure, the drawings are for the purpose of understanding the present disclosure and are not to be used to limit the present disclosure in any way. The description in the specification is merely a typical example and does not limit the scope of claims or application examples of the present disclosure in any way.

Although the embodiments are described in sufficient detail for those skilled in the art to implement the present disclosure, it is needed to be understood that other implementations and forms are possible, and that changes in configuration and structure and replacement of various elements can be made without departing from the scope and spirit of the technical idea of the present disclosure. Therefore, the following description should not be interpreted as being limited thereto.

In the following description of the embodiments, an example will be shown in which a charged particle gun (electron gun unit) of the present disclosure is applied to a charged particle beam system (pattern measurement system) configured with a scanning electron microscope (SEM) using an electron beam and a computer system. However, the embodiments should not be construed as limiting, and the present disclosure can be applied to, for example, a wafer defect inspection system, an apparatus using a charged particle beam such as an ion beam, a general observation apparatus, and the like.

First Embodiment

FIG. 1 shows a configuration example of a charged particle beam system according to a first embodiment. In the example, the charged particle beam system is configured as a length measurement SEM 900. The length measurement SEM 900 includes an electron gun 901 (charged particle gun) that can be maintained in high vacuum in a casing 924. In the embodiment, electrons are used as an example of charged particles, but the present invention is also applicable to charged particle guns that emit other charged particles.

The length measurement SEM 900 is configured to include a primary electron accelerating electrode 926, an electronic lens 927, a diaphragm 928, a scanning coil 929, an electronic objective lens 930, a secondary electron detector 932, and the like in the casing 924 in addition to the electron gun 901. In FIG. 1, the casing 924 and an internal structure thereof are illustrated in a cross-sectional view when viewed from the side.

If electrons are emitted as charged particles from the electron gun 901 held in the casing 924 maintained in high vacuum, the emitted electrons are accelerated by the primary electron accelerating electrode 926 to which high voltage is applied by a high-voltage power supply 925. The electron beam 906 (charged particle beam) is focused by the focusing electronic lens 927. Next, an amount of beam current of the electron beam 906 is adjusted by the diaphragm 928. Next, the electron beam 906 is deflected by the scanning coil 929, and a wafer 905 (semiconductor wafer) as a sample is two-dimensionally scanned with the electron beam 906.

The electronic objective lens 930 is disposed directly above an electrostatic chuck 907 on which the wafer 905 is placed. The electron beam 906 is narrowed by the electronic objective lens 930, focused, and is incident on the wafer 905. Secondary electrons 931 generated on the wafer 905 as a result of the incidence of primary electrons (electron beam 906) are detected by the secondary electron detector 932. Since the amount of detected secondary electrons reflects a shape of a sample surface, the shape of the surface can be generated as an image based on information on the secondary electrons.

The wafer 905 is held on the electrostatic chuck 907 while ensuring a certain degree of flatness, and is fixed on an X-Y stage 904. The wafer 905 can be moved freely in both X- and Y-directions by driving the X-Y stage 904, and any position within the surface of the wafer 905 can be measured with the electron beam.

The X-Y stage 904 includes a lift mechanism for wafer transfer 933. An elastic body capable of vertically moving is incorporated into the lift mechanism for wafer transfer 933. Using the elastic body, the wafer 905 can be attached to and detached from the electrostatic chuck 907. The wafer 905 can be delivered to and from a load chamber 935 (preliminary exhaust chamber) through a cooperative operation of the lift mechanism for wafer transfer 933 and a transfer robot 934.

An operation when transferring the wafer 905 to be measured to the electrostatic chuck 907 will be described below. First, the wafer 905 set in a wafer cassette 936 is carried into the load chamber 935 by a transfer robot 938 of a mini-environment 937. The inside of the load chamber 935 can be evacuated and released to the atmosphere by a vacuum exhaust system (not shown). By opening and closing a valve (not shown) and operating the transfer robot 934, the wafer 905 is transferred onto the electrostatic chuck 907 while maintaining the degree of vacuum within the casing 924 at a level that poses no problem for practical use.

A surface electrometer 939 is attached to the casing 924. The surface electrometer 939 is fixed with a position thereof adjusted in the height direction so that a distance from a probe tip to the electrostatic chuck 907 or wafer 905 is appropriate, and is capable of measuring a surface voltage of the electrostatic chuck 907 or the wafer 905 in a non-contact manner.

The length measurement SEM 900 may include a computer system 920 that controls the electron gun 901. Each component of the length measurement SEM 900 described above can be implemented using a general-purpose computer. Each component may be implemented as a function of a program executed on the computer. In the example of FIG. 1, a configuration of a control system is implemented by the computer system 920. The computer system 920 includes at least a processor such as a central processing unit (CPU), a storage unit such as a memory, and a storage device such as a hard disk (including an image storage unit). For example, the computer system 920 may be configured as a multiprocessor system. Control related to each component of an electron optical system within the casing 924 may be implemented by a main processor. Control related to the X-Y stage 904, the transfer robot 934, the transfer robot 938, and the surface electrometer 939 may be implemented by a subprocessor. Image processing for generating a SEM image based on a signal detected by the secondary electron detector 932 may be implemented by the sub-processor.

The computer system 920 may include an input device for a user to input instructions and the like, and a display device for displaying a GUI screen for inputting the instructions and the like, a SEM image, and the like. The input device is a device that allows the user to input data or instructions, such as a mouse, a keyboard, and a voice input device. The display device is, for example, a displaying apparatus. Such an input and output device (user interface) may be a touch panel that can input and display data.

FIG. 2 is a cross-sectional view showing a configuration example of the electron gun 901 of FIG. 1. The electron gun 901 includes a Schottky electron source 101 (charged particle source) placed in a chamber 106. The chamber 106 has a flange 105 on an upper part thereof. The flange 105 is fixed to the upper part of the chamber 106 and an insulator 104, and is configured to seal a space between the insulator 104 and the chamber 106. Accordingly, the chamber 106 is exhausted to ultra-high vacuum of $1\times10^{-8}$ to $1\times10^{-9}$ Pa by a plurality of ion pumps 112.

The Schottky electron source 101 is an electron source that emits electrons by thermionic emission and field emission. As an example, as the Schottky electron source 101, a tungsten single crystal with a <001> crystal orientation attached to a tip of a tungsten hairpin can be used. The tip of the single crystal can be sharpened to a diameter of several hundred nm, and a (001) crystal plane can be disposed at the center of the tip. A zirconium diffusion source is provided near the center of the tungsten single crystal column. Due to the surface diffusion of zirconium atoms and oxygen atoms from the zirconium diffusion source to the tip of the tungsten single crystal, the work function of the (001) plane at the tip of the tungsten single crystal decreases to 2.8 eV. Here, by heating the tungsten single crystal to approximately 1,600 to 1,900 K, an electric field can be applied to the tip of the tungsten single crystal to emit an electron beam 103.

The electron beam 103 is emitted not only from the (001) plane at the tip of the tungsten single crystal but also from the (100) plane. Electrons emitted from the four planes are also called side emission. An electrode generally called a suppressor is attached to the electron source 101 to reduce thermionic emission.

The electron source 101 is fixed to the insulator 104 using a current and voltage terminal 111. The insulator 104 is fixed to the flange 105 as described above, and the flange 105 is fixed to the chamber 106. An extraction electrode 102 is attached to the insulator 104. The extraction electrode 102 is, for example, a cylindrical electrode made of stainless steel. Voltage is applied to the extraction electrode 102 from a high-voltage power supply 109 via the current and voltage terminal 111, thereby applying voltage of, for example, several kV to the electron source 101.

A heater 108 is installed on a side surface of the extraction electrode 102 to maintain a temperature of the extraction electrode 102 within a predetermined temperature range. The heater 108 is connected to the computer system 107 through a heater signal terminal 110 attached to the chamber 106. A control signal from the computer system 107 is transmitted to the heater 108 via the heater signal terminal 110, and the heater 108 is configured to be able to change the amount of heat generated according to the control signal. The computer system 107 is also connected to the extraction electrode 102 through the current and voltage terminal 111 and can monitor a current value and a voltage value of the extraction electrode 102.

If the electron beam 103 is emitted from the electron source 101, the extraction electrode 102 of high voltage and the electrode (not shown) that adjusts the amount of current are irradiated with the electron beam 103. Electric power is generated by high voltage and large current, and the electrodes (electrode portion) generate heat. By the heat generation, the electrode is thermally expanded, and an electric field applied to the tip and periphery of the electron source 101 changes, and thus an amount of emitted electrons may become unstable. In the specification, the extraction electrode 102, the electrode for adjusting the amount of current, the suppressor, and the like may be collectively referred to as "electrode portion".

The computer system 107 controls the heater 108 based on the current flowing through the extraction electrode 102 and the voltage applied to the extraction electrode 102 to maintain the temperature of the extraction electrode 102 within a predetermined temperature range. As an example, the computer system 107 holds a table as shown in FIG. 3, and controls the heater 108 according to the table. In the table, the horizontal axis represents the output [W], which is the product of the current amount and applied voltage described above, and the vertical axis represents the temperature of the heater 108. By determining the product of the obtained current amount and the applied voltage, a target temperature of the heater 108 can be specified and the heater 108 can be controlled. By controlling the temperature of the heater 108, the temperature of the extraction electrode 102 is kept within a predetermined temperature range, and a change in the electric field at the tip and periphery of the electron source 101 accompanying displacement of the extraction electrode 102 due to thermal expansion can be prevented. As a result, instability of the emission current and deviation of the electron beam trajectory can be reduced. A fluctuating temperature $\Delta T$ of the extraction electrode 102 is preferably controlled to be constant within $\Delta T \leq 0.008d/L\alpha$° C., where a is a coefficient of linear expansion of a material of the extraction electrode 102, L is a height of the extraction electrode, and d is a distance between the extraction electrode 102 and the electron source 101.

FIG. 4 shows results of electric field analysis when the distance d between the extraction electrode 102 and the electron source 101 is varied. To keep the current fluctuation to 1% or less, a change $\Delta d$ in the distance d between the extraction electrode 102 and the electron source 101 needs to be 0.8% or less. To keep the change in the distance d between the extraction electrode 102 and the electron source 101 within 0.8%, a change $\Delta L$ in the height of the extraction electrode 102 needs to be 0.8% or less with respect to the distance d. It is because the extraction electrode 102 whose temperature changes has a cylindrical shape having the height L because the extraction electrode 102 needs to be disposed in a form surrounding the electron source 101. For example, when stainless steel material (SUS material) is used for the extraction electrode 102, the coefficient of linear expansion of SUS material is $16\times10^{-6}$ (° $C.^{-1}$), and thus when L=10 (mm) and d=0.5 (mm), to keep the current fluctuation to 1% or less, the temperature fluctuation of the extraction electrode 102 needs to be kept constant within 25° C.

The heater 108 is most effective when disposed at a location where the temperature gradient is greatest in the extraction electrode 102. As the heater 108, a ceramic heater or a wire-wound heater can be used. By using the wire-wound heater, it is possible to prevent a magnetic field generated by the signal current flowing through the heater 108 from bending a trajectory of the emitted electrons. The wire-wound heater is preferably covered with a high permeability material such as permalloy.

The location where the temperature gradient can be greatest in the extraction electrode 102 may be a location that satisfies the conditions of being perpendicular to the direction of heat transfer, having a small cross-sectional area, having a small surface area, and being near a heat source. For example, in an extraction electrode that has a substantially uniform cross-sectional area and approximately the same local surface area, such as the extraction electrode shown in FIG. 2, it is considered that a location near the electron source 101, which is the heat source, is the location where the temperature gradient is greatest. Therefore, in FIG. 2, the heater 108 is installed at a position near the electron source 101.

As a modification, a method for dividing the heater 108 into a plurality of parts and arranging the heaters is also effective. FIGS. 5A and 5B show configuration examples in which the heater 108 is divided and arranged (A to D). By dividing the heater 108, heat at each location can be controlled in more detail. As shown in FIG. 5B, by dividing the extraction electrode 102 itself into multiple parts, the temperature can also be individually adjusted while monitoring the amount of current with which the divided electrodes are irradiated. When the beam spreads into an ellipse due to axis misalignment, non-uniform thermal expansion may occur and the beam trajectory may deviate from the central axis of the electron source 101. However, by using split electrodes and heaters, thermal expansion can be kept uniform in more detail, and deviation correction of the beam trajectory becomes possible.

In the above example, it has been described that the heater 108 is controlled based on the relationship between the temperature and the output of the extraction electrode 102 shown in FIG. 3, but instead of or in addition to the above example, it is also possible to control the heater 108 based on a control table, a differential result of a monitored current value, and the like.

Instead of or in addition to the current and voltage of the extraction electrode 102, the current value and voltage value of other electrodes such as the suppressor of the Schottky electron source 101 may be detected, and the temperature of the heater 108 may be controlled according to the detection result.

In the first embodiment described above, the heater 108 is used to heat the extraction electrode 102, but the heater 108 may include a cooling mechanism instead of or in addition to the heating mechanism. In the case of the cooling mechanism, it is preferable to dispose the cooling mechanism near a portion of the extraction electrode 102 where the temperature is highest. In the case of the cooling mechanism, similarly to the heater 108 (including only the heating mechanism), it is preferable to dispose the cooling mechanism at a location that satisfies the conditions of having a small cross-sectional area perpendicular to the direction of heat transfer, having a small surface area, and being near the electron source 101, which is the heat source. In the length measurement SEM 900 shown in FIG. 1, it is also possible to adopt a configuration in which the heater (heating mechanism) and the cooling mechanism are used at the same time, and it is enough when the temperature of the electrode portion as a whole can be adjusted. For example, when a component with low heat resistance is incorporated, it may be preferable to dispose the cooling device around the component.

As another modification, the temperature control by the heater 108 may be executed using a graphical user interface (GUI) screen as shown in FIG. 5C. As shown in FIG. 5C, the GUI screen may display, for example, a detected value 1024 of the voltage applied to the extraction electrode 102, an amount of current 1025 flowing through the extraction electrode 102, a time differential value (dA/dt) 1026 of the temperature of the extraction electrode 102, a temperature 1027 of the heater 108, a determination result (OK, NG, and the like) 1028 of an operating state, and the like. A graph 1020 showing a change in the temperature of the extraction electrode 102 may be displayed. The graph 1020 can be a graph according to the results of recording the temperature of the heater 108 in the computer system 107 at predetermined time intervals.

A table 1019 for estimating the temperature of the extraction electrode 102 can also be displayed. To finely adjust the table 1019, it is also possible to input inclination 1021 and intercept (shift amount) 1022 of the table showing the relationship between an electric power amount and an electrode temperature on the GUI screen. Input can be performed, for example, using an input device such as a mouse or a keyboard provided in the computer system 920.

When the time differential value 1026 of the temperature of the extraction electrode 102 exceeds a certain threshold, a warning display 1023 warning that the emission current of the electron source is unstable can be displayed on the GUI screen. Not only for the differential value, but also, for example, when temperature control is performed more than a fixed number of times within a prescribed time, the warning display 1023 can be displayed to notify the user that the state of the electron gun 901 is unstable. Accordingly, it is possible to prevent errors from occurring in subsequent processes by inspecting or measuring the length of a semiconductor pattern while the state of the electron gun is unstable.

Second Embodiment

Next, with reference to FIG. 6, a configuration example of a charged particle beam system according to a second embodiment will be shown. Similarly to the first embodiment, the second embodiment will also be described using an example in which the charged particle beam system is configured as the length measurement SEM 900. The overall configuration of the length measurement SEM 900 of the second embodiment may be the same as that of the first embodiment (FIG. 1), and thus redundant description will be omitted. As shown in FIG. 6, the second embodiment differs from the first embodiment in the configuration of the electron gun 901.

In the electron gun 901 of the second embodiment, the extraction electrode 102 is fixed to a voltage introduction electrode for introducing voltage to the extraction electrode 102 with a screw 313 or the like, and is electrically connected to the voltage introduction electrode 312. The voltage introduction electrode 312 is fixed to the lower end of the insulator 104, is connected to the current and voltage terminal 111, and is applied with high voltage from the high-voltage power supply 109. That is, in the second embodiment, the extraction electrode 102 has a structure to which high voltage is applied via the current and voltage terminal 111 and the voltage introduction electrode 312.

As such, in the second embodiment, the extraction electrode 102 has the voltage introduction electrode 312 between the extraction electrode 102 and the current and voltage terminal 111, such that a structure in which a voltage application portion is divided into the extraction electrode 102 and the voltage introduction electrode 312 is adopted. By adopting such a divided structure, manufacturing and assembling of parts can be facilitated.

Extraction voltage is applied to the extraction electrode 102 from the high-voltage power supply 109. The extraction electrode 102 and the voltage introduction electrode 312 are fixed with the screws 313, and a contact area therebetween is small. Therefore, the temperature of the extraction electrode 102 is easily increased, and thermal expansion is easy to occur. To solve such problem, in the second embodiment, the heater 108 is installed on the voltage introduction electrode 312 that holds the extraction electrode 102. Accordingly, the voltage introduction electrode 312 is heated, and the temperature can be controlled to reduce the temperature difference between the extraction electrode 102 and the voltage introduction electrode 312.

In the second embodiment, the heater 108 is preferably disposed at a location where the temperature gradient is greatest, among the extraction electrode 102 and the voltage introduction electrode 312. For example, it is preferable to dispose the heater 108 near the screw 313 that connects the extraction electrode 102 and the voltage introduction electrode 312, or near a boundary where the material of the electrode changes. The heater 108 is connected to the computer system 107 via the terminal 110 attached to the chamber 106, similar to the first embodiment. The computer system 107 is also connected to the voltage introduction electrode 312 that holds the extraction electrode 102 by current/voltage detection wiring (not shown), and can monitor the current value and voltage value of the voltage introduction electrode 312.

In the length measurement SEM 900 of the second embodiment, while electrons are being emitted from the electron source 101, the extraction electrode 102 may expand due to the current flowing through the extraction electrode 102 and the voltage introduction electrode 312, and the voltage value applied to the extraction electrode 102, which may cause a positional deviation. Therefore, as shown in FIG. 3, for example, a relationship between the temperature of the extraction electrode 102 and the product of the current value and the voltage value is determined in advance, and based on the relationship, the temperature of the heater 108 is controlled based on the obtained current value and voltage value. By controlling the temperature of the heater 108, the temperature difference between the extraction electrode 102 and the voltage introduction electrode 312 can be reduced, thereby preventing the displacement of the extraction electrode 102 due to thermal expansion. Changes in the electric field at the tip and periphery of the electron source 101 can be prevented, and instability of the emission current and deviation of the electron beam trajectory can be reduced.

Third Embodiment

Next, with reference to FIG. 7A, a configuration example of a charged particle beam system according to a third embodiment will be shown. Similarly to the first embodiment, the third embodiment will also be described using an example in which the charged particle beam system is configured as the length measurement SEM 900. The overall configuration of the length measurement SEM 900 of the third embodiment may be the same as that of the first embodiment (FIG. 1), and thus redundant description will be omitted. As shown in FIG. 7A, the third embodiment differs from the first embodiment in the configuration of the electron gun 901.

As shown in FIG. 7A, the electron gun 901 according to the third embodiment differs from the embodiments described above in that the electron gun 901 is configured so that the heater 108 is not brought into direct contact with the extraction electrode 102. Specifically, the heater 108 is mounted on a heater holder 414 (temperature adjustment unit holding unit) provided on the inner wall of the chamber 106 in close proximity to the extraction electrode 102 in a non-contact manner. The heater 108 does not directly contact (non-contact) various electrodes including the extraction electrode 102, and is mounted on the heater holder 414 fixed to the inner wall of the chamber 106. The heater 108 can be a wire-wound heater, similar to the embodiments described above.

By making a current flow through the wire-wound heater of the heater 108, a magnetic field is generated, which may bend the trajectory of the electron beam emitted from the electron source 101. Therefore, it is preferable to use a metal member with high magnetic permeability, such as permalloy, for the heater holder 414. To prevent the temperature of the chamber 106 from rising, a heat-insulating agent may be interposed between the heater holder 414 and the chamber 106.

FIG. 7B shows an electron gun 901 according to a modification of the third embodiment. The modification includes a flat plate-shaped heater holder 414 that extends below the extraction electrode 102 from the inner wall of the chamber 106, and the heater 108 is disposed on the surface of the heater holder 414 without being in direct contact with the extraction electrode 102. In the modification as well, a heat insulating material may be interposed between the heater 108 and the extraction electrode 102.

Fourth Embodiment

Next, with reference to FIG. 8, a configuration example of a charged particle beam system according to a fourth embodiment will be shown. Similarly to the first embodiment, the fourth embodiment will also be described using an example in which the charged particle beam system is configured as the length measurement SEM 900. The overall configuration of the length measurement SEM 900 of the fourth embodiment may be the same as that of the first embodiment (FIG. 1), and thus redundant description will be omitted. As shown in FIG. 8, the fourth embodiment differs from the first embodiment in the configuration of the electron gun 901.

The electron gun 901 of the fifth embodiment differs from the embodiments described above in that the electron gun 901 is configured to measure the temperature of the extraction electrode 102 by a thermo camera 515. A viewport 516 for observing the extraction electrode 102 from the outside is attached to the chamber 106. The thermo camera 515 is installed behind the viewport 516, and can optically image the extraction electrode 102 through the viewport 516 to monitor the temperature of the extraction electrode 102. For example, the thermo camera 515 is an example of an apparatus for optically detecting the temperature distribution of the extraction electrode 102, and is not limited thereto. For example, a normal photodetector or the like may be used instead of a thermo camera.

Fifth Embodiment

Next, with reference to FIG. 9, a configuration example of a charged particle beam system according to a fifth embodiment will be shown. Similarly to the first embodiment, the fifth embodiment will also be described using an example in which the charged particle beam system is configured as the length measurement SEM 900. The overall configuration of the length measurement SEM 900 of the fifth embodiment may be the same as that of the first embodiment (FIG. 1), and thus redundant description will be omitted. As shown in FIG. 9, the fifth embodiment differs from the first embodiment in the configuration of the electron gun 901.

As shown in FIG. 9, the electron gun 901 of the fifth embodiment includes a strain gauge 617 connected to a part of the extraction electrode 102, for example, the bottom surface. By the strain gauge 617, an amount of strain of the extraction electrode 102 caused by irradiation with the electron beam 103 can be measured, and the temperature of the heater 108 can be controlled so that the strain is constant. In addition to the measurement results of the strain gauge 617, the current and voltage of the extraction electrode 102 can be measured together and used for controlling the temperature of the heater 108, similarly to the embodiments described above.

Sixth Embodiment

Figure 10B:
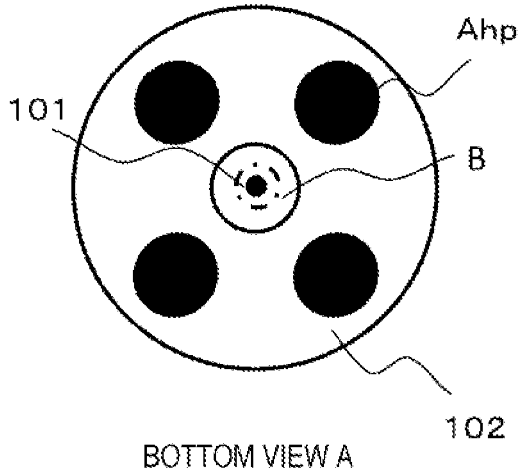
Figure 10C:
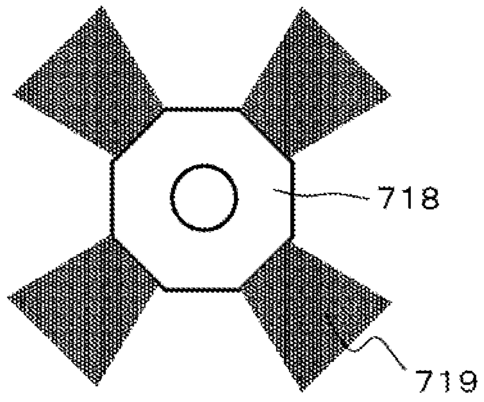

With reference to FIG. 10, a configuration example of a charged particle beam system according to a sixth embodiment is shown. Similarly to the first embodiment, the sixth embodiment will be described using an example in which the charged particle beam system is configured as the length measurement SEM 900. The overall configuration of the length measurement SEM 900 of the sixth embodiment may be the same as that of the first embodiment (FIG. 1), and thus redundant description will be omitted. As shown in FIG. 10, the sixth embodiment differs from the first embodiment in the configuration of the electron gun 901.

As shown in FIG. 10(*a*), a shape of the electron gun 901 of the sixth embodiment when viewed from the lateral direction is approximately the same as that of the second embodiment, but as shown in FIGS. 10(*b*) and 10(*c*), the shape of the bottom surface of the extraction electrode 102 is different from that of the second embodiment. A tip portion 718 of the Schottky electron source 101 has an octagonal shape, as shown in the enlarged view of FIG. 10(*c*). Electrons are emitted from four of eight faces of the octagon. Electrons emitted from the four faces are also called side emission 719. Among the electron beams emitted from the electron source 101, the side emission 719 is a main component with which the extraction electrode 102 is irradiated. Therefore, in the sixth embodiment, a portion Ahp (FIG. 10(*b*)) of the extraction electrode 102, which the side emission 719 reaches, is configured to have higher thermal conductivity than other portions. Accordingly, the temperature of the extraction electrode 102 can be easily kept uniform.

As an example, in the portion Ahp, a metal film having higher thermal conductivity than other portions of the extraction electrode 102 can be formed. As an example, when the extraction electrode 102 is made of stainless steel, the metal film of the portion Ahp can be made of, for example, an aluminum alloy. Alternatively, by forming a hole or a notch in the portion Ahp, it is also possible to make the thermal conductivity higher than that in other portions. By providing the hole, conductance near the extraction electrode 102 increases, so that efficient vacuum exhaust becomes possible and electron emission can be more stabilized.

Seventh Embodiment

With reference to FIG. 11, a configuration example of a charged particle beam system according to a seventh embodiment is shown. Similarly to the first embodiment, the seventh embodiment will be described using an example in which the charged particle beam system is configured as the length measurement SEM 900. The overall configuration of the length measurement SEM 900 of the seventh embodiment may be the same as that of the first embodiment (FIG. 1), and thus redundant description will be omitted. As shown in FIG. 11, the seventh embodiment differs from the first embodiment in the configuration of the electron gun 901.

The electron gun 901 of the seventh embodiment includes a diaphragm 820 below the extraction electrode 102. The diaphragm 820 prevents unnecessary side emission from reaching the sample (wafer 905 or the like). By providing the diaphragm 820, even if the hole diameter of the extraction electrode 102 is increased, unnecessary electron beams can be prevented from reaching the sample. Since the hole diameter of the extraction electrode 102 can be increased, the amount of electron beam with which the extraction electrode 102 is irradiated is reduced, and the temperature rise of the extraction electrode 102 can be prevented.

As the hole diameter of the extraction electrode 102 becomes larger, the electric field applied to the tip of the electron source 101 becomes smaller. Therefore, to obtain the same amount of current, the voltage applied to the extraction electrode 102 needs to be increased. Here, it is preferable to prevent the electrons reflected by the diaphragm 820 from hitting the extraction electrode 102.

When the electron beam is shaped to not hit the extraction electrode 102, the side emission has a large variation in energy, and the obtained electron beam becomes an electron beam of poor quality including flare or the like. Therefore, the side emission needs to be cut before reaching the sample. However, when the diaphragm 820 is disposed at a position away from the electron source 101 to cut the electron beam, the electron beam spreads radially. Therefore, when the hole diameter of the diaphragm 820 is the same as the hole diameter of the extraction electrode 102, only a small portion of the electron beam near the central axis of the electron beam can reach the sample, which makes it difficult to observe the sample with high throughput.

On the other hand, when the hole diameter of the diaphragm is increased, since conductance is improved, pressure near the electron source 101 increases as gas downstream of the electron gun blows up, which makes the current unstable, and the distance from the electron source 101 to the diaphragm 820 needs to be increased, which leads to an increase in size of the apparatus.

To solve the problem described above, it is preferable to dispose the diaphragm 820 close to the extraction electrode 102 while making the hole diameter of the hole portion of the diaphragm 820 smaller than that of the extraction electrode 102. When a potential difference between the diaphragm 820 and the extraction electrode 102 is large, discharge occurs between the extraction electrode 102 and the diaphragm 820, and thus the electron source 101 may be damaged. Therefore, as shown in FIG. 13, it is preferable to apply voltage, which is the same as the voltage of the extraction electrode 102 or has a difference of ±10% or less (within a ratio of 1±0.1), to the diaphragm 820 to form an electron beam while preventing discharge.

In the case of the configuration described above, since the temperature of the diaphragm 820 becomes high and the extraction electrode 102 is also heated by radiation, it is preferable to mount the heater 108 on the diaphragm 820 and adjust the temperature of the diaphragm 820, as shown in FIG. 11. The heater 108 can be disposed in a non-contact manner with the extraction electrode 102, and the degree of freedom of a position of the temperature control mechanism is increased. Therefore, more efficient temperature control than other embodiments is possible, and the environmental load can be reduced. Instead of mounting the heater 108 on the diaphragm 820, it is also possible to mount the heater 108 on the extraction electrode 102, similarly to the embodiments described above (see FIG. 12).

As described above, the reason why the ratio of the voltage applied to the diaphragm 820 to the voltage applied to the extraction electrode 102 is set to 1±0.1 (±10% or less) is to stabilize the electron beam. When the diaphragm 820 is disposed directly below the extraction electrode 102 and voltage is applied thereto, an electrostatic lens is formed by the diaphragm 820. By the electrostatic lens, the beam trajectory of the electron beam is changed, which makes it difficult to control probe current with which the sample is irradiated. FIG. 13 shows a current fluctuation rate when the diaphragm 820 is disposed and a voltage ratio between the voltage applied to the extraction electrode 102 and the voltage applied to the diaphragm 820 is plotted on the horizontal axis. It can be seen from FIG. 13 that when the voltage ratio between the extraction electrode 102 and the diaphragm 820 is 1±0.1, a change rate in the probe current is around 0%. Therefore, it is preferable that the voltage of the diaphragm 820, with which a change in beam trajectory of the electron beam is small and the probe current can be stably maintained, is set such that the ratio with the voltage applied to the extraction electrode 102 is 1±0.1. When the voltage ratio becomes 0.1 or more, since the change rate of the probe current increases in a quadratic curve, the risk of discharge increases, and control is performed with a current amount that is different from the original current amount, so that accurate inspection and observation results cannot be obtained.

By setting such a voltage ratio, it is possible to eliminate feedback, and thus there is a great advantage from the viewpoint of controllability. An example of eliminating feedback includes heating or cooling the diaphragm with higher power than power generated by electron beam irradiation to eliminate the temperature change of the diaphragm 820. The embodiment may be used in combination with the embodiment shown in FIG. 4.

The present invention is not limited to the embodiments described above, and includes various modifications. For example, the embodiments described above have been described in detail to describe the present invention in an easy-to-understand manner, and the present invention is not necessarily limited to those having all the configurations described. A part of a configuration of a certain embodiment can be replaced with a configuration of another embodiment. The configuration of another embodiment can be added to the configuration of the certain embodiment. Other configurations may be added to, deleted from, or replaced with a part of the configuration of each embodiment.

REFERENCE SIGNS LIST

101: electron source
102: extraction electrode
103: electron beam
104: insulator
105: flange
106: chamber
107: computer system
108: heater
109: high-voltage power supply
110: heater signal terminal

111: current and voltage terminal
112: ion pump
312: voltage introduction electrode
313: screw
414: heater holder
515: thermo camera
516: viewport
617: strain gauge
718: electron source tip
719: side emission
820: diaphragm
900: length measurement SEM
901: electron gun
904: X-Y stage
905: wafer
906: electron beam
907: electrostatic chuck
920: computer system
924: casing
925: high-voltage power supply
926: primary electron accelerating electrode
927: electronic lens
928: diaphragm
929: scanning coil
930: electronic objective lens
931: secondary electron
932: secondary electron detector
933: lift mechanism for wafer transfer
934: transfer robot
935: load chamber
936: wafer cassette
937: mini-environment
938: transfer robot
939: surface electrometer

The invention claimed is:

1. A charged particle gun comprising:

a charged particle source that generates a charged particle;

an electrode portion that includes an extraction electrode for extracting a charged particle beam from the charged particle source;

a voltage introduction unit that introduces voltage to the electrode portion; and a temperature adjustment unit that adjusts a temperature of the electrode portion, wherein the temperature adjustment unit is configured to adjust the temperature of the electrode portion based on a change in a state of the electrode portion, the temperature adjustment unit adjusts the temperature of the electrode portion based on current and voltage of the electrode portion, and the temperature adjustment unit acquires a relationship between the current and voltage of the electrode portion and the temperature of the electrode portion as a table in advance, estimates the temperature of the electrode portion according to the acquired current and voltage of the electrode portion, and adjusts the temperature of the electrode portion.

2. The charged particle gun according to claim 1, wherein the extraction electrode includes a plurality of divided electrodes, and the temperature adjustment unit includes a temperature adjustment unit connected to each of the plurality of divided electrodes.

3. The charged particle gun according to claim 1, wherein the electrode portion includes the extraction electrode and a voltage introduction electrode connected to the extraction electrode for introducing voltage to the extraction electrode, and the temperature adjustment unit is connected to the voltage introduction electrode.

4. The charged particle gun according to claim 1, further comprising:

a temperature adjustment unit holding unit that is disposed around the extraction electrode and holds the temperature adjustment unit, wherein the temperature adjustment unit is disposed in the temperature adjustment unit holding unit in a non-contact state with the extraction electrode.

5. The charged particle gun according to claim 1, further comprising:

a diaphragm disposed below the extraction electrode, wherein a hole diameter of a hole of the diaphragm is smaller than a hole diameter of a hole of the extraction electrode.

6. The charged particle gun according to claim 5, wherein a ratio of first voltage applied to the diaphragm and second voltage applied to the extraction electrode is set in a range of 1±0.1.

7. A charged particle beam apparatus, comprising: the charged particle gun according to claim 1.

8. A charged particle gun comprising:

a charged particle source that generates a charged particle;

an electrode portion that includes an extraction electrode for extracting a charged particle beam from the charged particle source;

a voltage introduction unit that introduces voltage to the electrode portion; and a temperature adjustment unit that adjusts a temperature of the electrode portion, wherein the temperature adjustment unit is configured to adjust the temperature of the electrode portion based on a change in a state of the electrode portion, wherein the temperature adjustment unit includes a detection unit for optically detecting a temperature distribution of the electrode portion, and adjusts the temperature of the electrode portion according to a detection result of the detection unit.

9. A charged particle gun comprising:

a charged particle source that generates a charged particle;

an electrode portion that includes an extraction electrode for extracting a charged particle beam from the charged particle source;

a voltage introduction unit that introduces voltage to the electrode portion; and a temperature adjustment unit that adjusts a temperature of the electrode portion; and a strain gauge that measures an amount of strain in the extraction electrode, wherein the temperature adjustment unit is configured to adjust the temperature of the electrode portion based on a change in a state of the electrode portion, and the temperature adjustment unit adjusts the temperature of the extraction electrode according to the amount of strain.

10. A charged particle gun comprising:

a charged particle source that generates a charged particle;

an electrode portion that includes an extraction electrode for extracting a charged particle beam from the charged particle source;

a voltage introduction unit that introduces voltage to the electrode portion; and a temperature adjustment unit that adjusts a temperature of the electrode portion, wherein the temperature adjustment unit is configured to adjust the temperature of the electrode portion based on a change in a state of the electrode portion, and wherein the temperature adjustment unit is placed outside the extraction electrode.

* * * * *